April 22, 1969 R. E. J. GERARD 3,440,553

TRANSISTOR AMPLIFIERS HAVING BOTH CURRENT AND VOLTAGE RESPONSIVE FEEDBACK PROVISIONS

Filed Dec. 8, 1965

INVENTOR

Roger Edwin John Gerard

BY

Baldwin & Wight

ATTORNEYS

United States Patent Office 3,440,553
Patented Apr. 22, 1969

3,440,553

TRANSISTOR AMPLIFIERS HAVING BOTH CURRENT AND VOLTAGE RESPONSIVE FEEDBACK PROVISIONS

Roger Edwin John Gerard, London, England, assignor to The Marconi Company Limited, London, England, a British company Filed Dec. 8, 1965, Ser. No. 512,494
Claims priority, application Great Britain, Jan. 6, 1965, 654/65
Int. Cl. H03f *1/08, 1/34*
U.S. Cl. 330—28 5 Claims

ABSTRACT OF THE DISCLOSURE

A transistor amplifier having a current feedback loop provided by a current transformer with its primary in series with the load terminals in the output electrode circuit of the transistor and its secondary included in a circuit between the remaining two electrodes of the transistor and a voltage feedback loop including a matching impedance. The transistor amplifier is driven from a suitably selected current source, the current feedback loop providing stabilized current gain and the voltage feedback loop providing impedance matching.

This invention relates to transistor amplifiers and has for its object to provide improved wide band high power transistor amplifiers with negative feedback which shall have a high degree of linearity and freedom from distortion, shall be of stable gain, and shall present a desired predictable output impedance to match the impedance of a specified load to be fed thereby.

The use of linearising negative feedback in transistor amplifiers is of course common. One well known way of achieving negative feedback is by what may be termed current feedback. An example of this is provided by an arrangement in which the primary of a current feedback transformer is included in series with the load in the collector circuit of a transistor to the base of which the signals to be amplified are applied, the secondary of the transformer being connected at one end to the said base and at the other end through a D.C. blocking capacitor to the emitter of the transistor which is at earth potential with respect to high frequency. The input impedance between base and emitter of the transistor is low and, when transferred to the collector circuit by the transformer as an effective impedance in series with the load, becomes lower still. Although the current negative feedback stabilises the current gain and good linearisation is obtainable, this type of arrangement has the defect that the effective output impedance to the amplifier is very high, being not seriously different from that of the transistor itself and accordingly the amplifier does not provide a good impedance match with loads of the values ordinarily encountered in practice. Moreover the effective output impedance is not in practice predictable or even constant because it will often not be the same for different transistors even if of the same nominal type while even with a particular transistor it is liable to vary or drift with variations in operating conditions such as temperature and/or frequency. Moreover it may change materially with aging of the transistor. The defect of bad matching between the effective output impedance and the load could, of course, be overcome by providing an added matching resistance in parallel with the load but only at the expense of substantial power loss in the matching resistance.

Another well known way of achieving negative feedback is by what may be termed voltage feedback. An example of this type is provided by an arrangement in which a feedback resistance is connected between the collector and base of a transistor having an emitter at earth potential as respects high frequency, a load fed from the collector, and input signals to be amplified applied to the base. Here again good linearisation and stabilisation of effective circuit gain is obtainable but the effective output impedance is directly proportional to the value of the feedback resistance and inversely proportional to the transistor gain. The transistor gain is, however, far from constant with frequency—it may vary by a factor of many times over a wide range of frequencies—and accordingly the effective output impedance is not predictable, and is far from being constant over a wide frequency band. Good impedance matching over the band to a given load is therefore not obtained in a wide band amplifier of this known type.

The present invention seeks to overcome the defects and difficulties of known negative feedback transistor amplifiers as above described.

According to this invention a transistor amplifier is provided with two negative feedback loops of which one is a current feedback loop for stabilising gain and the other is a voltage feedback loop in which a matching impedance, i.e. an impedance dimensioned to provide the amplifier with an effective output impedance substantially matching a pre-determined load impedance, is included.

Preferably the current feedback loop is provided by a current transformer having its primary in effective series with the load terminals in the output electrode circuit of the transistor and its secondary included in a circuit between the other two electrodes of said transistor.

The voltage feedback loop may be provided simply by a matching impedance included in circuit between the "live" load terminal fed from the output electrode of the transistor and the input electrode of said transistor. Preferably however an additional transformer, which is a voltage transformer, is provided and one winding thereof is connected at one end through a matching impedance to the live load terminal fed from the output electrode of the transistor, the other winding thereof being effectively connected at one end to the input electrode of the transistor and the remaining winding ends being effectively connected together to the remaining transistor electrode. In a modification of the last described arrangement a single three-winding transformer having one winding in the output electrode circuit of the transistor, another in series with the matching impedance, and a third connected at one end to the transistor input electrode replaces the two separate transformers.

Undesired phase shift effects in the transistor may, if required, be compensated for in all cases by shunting the matching impedance by a small capacitance.

The invention is well suited to very wide band very high frequency amplifiers. In an example it has been used successfully experimentally for an amplifier covering the band of 2–30 mc./s.

The invention solves the problem of securing a matched output impedance without wasting half the collector output power of the output transistor (or transistors if there are two or more in parallel) in a matching resistance (as is usually done in comparable known apparatus) and does so by directing substantially all the collector output power to the load. Accordingly it enables the output transistor dissipation for a given load to be almost halved and the number of transistors (if there are two or more in parallel) in an output stage to be substantially reduced as compared with known comparable practice.

Figures 1, 2, 3:
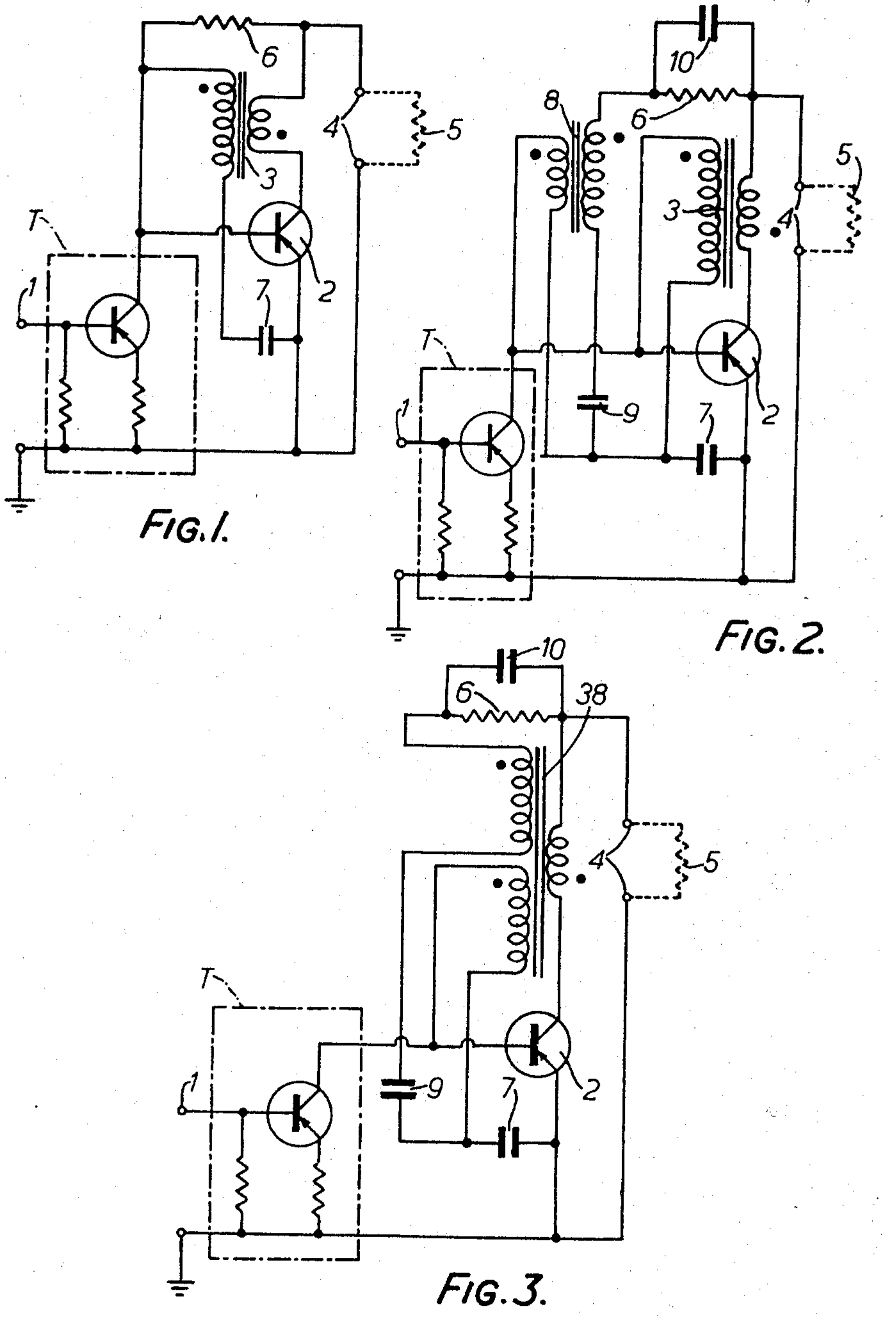
FIGURE 1 is a diagrammatic illustration of a transistor amplifier and shows an amplifying transistor driven from a current source and having both current and voltage responsive feedback circuits connected thereacross.
FIGURE 2 is a diagrammatic illustration of a further transistor amplifier arrangement according to this invention and illustrates the employment of a voltage transformer forming a part of the voltage responsive feedback provisions and in addition to the current transformer included in the current responsive feedback provisions connected across the amplifying transistor.
FIGURE 3 is a diagrammatic illustration of a further amplifier arrangement according to this invention and shows the employment of a three-winding, combined current and voltage transformer for applying both voltage responsive and current responsive feedback across the amplifying transistor.

The invention is illustrated in the accompanying drawings which show diagrammatically and in simplified circuit form three embodiments. In the drawings transformer winding senses are indicated conventionally by dots and D.C. supply sources are not shown. In all three figures the transistor circuit within the chain line block T is merely a suitable known form of driving current source and forms per se no part of the invention. Like references denote like parts throughout the figures.

Referring to FIGURE 1, very high frequency signals to be amplified and lying within a wide frequency band for example 2–30 mc./s. are applied at input terminal 1 to a driving current source within the chain line block T. The output from this source is applied to the base of a transistor 2 in whose output collector circuit is the primary of a current transformer 3. The load terminals of the amplifier are the terminals 4 and a load represented by a resistance 5 of known value is shown in broken lines. A matching resistance 6 dimensioned in accordance with known principles to provide the amplifier with an effective output impedance matching the load 5 is connected between the "live" load terminal and the base of the transistor 2. The other winding of the transformer is connected between the base of the transistor 2 and the emitter thereof the condenser 7 being merely a blocking capacitor. A practical value for the turns ratio of the transformer 3 is 1/2 though this is not critical.

With this arrangement the combination of current feedback provided by the transformer 3 and voltage feedback provided by the circuit including the matching resistance 6 produces stabilised current gain, good linearisation and a predictable output impedance substantially matching the lead over a wide range of gain of the transistor 2. The arrangement has however the defect that there is substantial absorption of power in the matching resistance 6. This is, of course, undesirable. The larger the turn ratio of the transformer 3 the greater the value that must be chosen for the matching resistance 6 to match a given load 5 and therefore the less will be the loss in said matching resistance. By using a large turn ratio for the transformer 3, for example a turn ratio of 5/1, the loss in the matching resistance 6 may be reduced, but there is always some loss which will be relatively high if the feedback required is large, i.e. the turn ratio is small.

FIGURE 2 shows a preferred arrangement in which loss in the matching resistance is minimised. FIGURE 2 differs from FIGURE 1 in the provision of an additional transformer 8 which is a voltage transformer. The current transformer 3 is connected in the same way as in FIGURE 1 but the matching resistance is connected between the live load terminal and, through winding of the transformer 8, to the emitter of the transistor 2 while the other winding of the transformer 8 is connected between the base and the emitter of the said transistor 2. As will be apparent, the provision of the added voltage transformer 8 (the turn ratio of which again is not critical but for which practical figures are 2/1 to 7/1) greatly reduces the losses in the matching resistance 6. Capacitor 9, like capacitor 7, is merely a blocking condenser.

Any transistor will of course produce some phase shift and if in any particular case this is excessive having regard to the purpose for which the amplifier is intended it may be compensated for by providing a shunt capacitance across the matching resistance. This is also illustrated in FIGURE 2 in which a capacitor 10 of a few pico-farads capacitance is shown across the matching resistance 6. FIGURE 3 shows a variant of FIGURE 2 the variation from FIGURE 2 being practically self-evident from the drawing itself. It consists merely is substituting for the two separate transformers 3 and 8 of FIGURE 2 a three winding transformer 38 having its primary in the collector circuit and two further windings, the one between base and emitter providing current feedback and the other, in circuit with the matching resistance, providing voltage feedback.

I claim:

1. A transistor amplifier including an input circuit, current source driving stage means in said input circuit for providing a driving current dependent on the input applied to said input circuit, a transistor having a driving terminal connected with said current source driving stage means, an output circuit for providing an output from said amplifier, said transistor including an output terminal connected with said output circuit for applying a transistor output signal thereto, current feedback means for stabilizing current gain in said transistor amplifier including a current transformer having the primary thereof connected in series between said output terminal of said transistor and said output circuit and having the secondary thereof connected in said input circuit between said driving terminal of said transistor and the remaining terminal of said transistor for providing feedback determined by the output current from said transistor, and voltage feedback means including a matching impedance connected between said output circuit and said input circuit for providing feedback determined by the output voltage from said transistor amplifier.

2. An amplifier as claimed in claim 1 wherein said output circuit includes a live output terminal fed from the output terminal of said transistor, said matching impedance being connected in circuit between the live load terminal fed from the output terminal of the transistor and the driving terminal of said transistor.

3. An amplifier as claimed in claim 1 wherein said voltage feedback means includes a voltage transformer having one winding thereof connected at one end through said matching impedance to a point in said output circuit driven from said output terminal of the transistor, said voltage transformer having another winding thereof being electrically connected at one end to the driving terminal of the transistor and the remaining winding ends of said voltage transformer being electrically connected together to the remaining transistor terminal.

4. The amplifier according to claim 1 including a single three-winding transformer having a first winding thereof included in said current feedback means to form a part of said current transformer, a second winding included in said voltage feedback means and connected in series with the matching impedance, and a third winding connected at one end to the transistor driving terminal and coupled to both said first and second windings for applying feedback responsive to both output current and output voltage.

5. An amplifier as claimed in claim 1, including a capacitance connected across said matching impedance for substantially compensating undesired phase shift effects in the transistor.

References Cited

UNITED STATES PATENTS

| | | | |
|---|---|---|---|
| 2,166,929 | 7/1939 | Caruthers | 330—102 |
| 2,167,368 | 7/1939 | Meyers | 330—102 |
| 3,134,080 | 5/1964 | Story | 330—28 X |

ROY LAKE, *Primary Examiner.*

JAMES B. MULLINS, *Assistant Examiner.*

U.S. Cl. X.R.

330—102, 105